United States Patent
Cheng et al.

(10) Patent No.: US 11,063,117 B2
(45) Date of Patent: Jul. 13, 2021

(54) SEMICONDUCTOR DEVICE STRUCTURE HAVING CARRIER-TRAPPING LAYERS WITH DIFFERENT GRAIN SIZES

(71) Applicant: Taiwan Semiconductor Manufacturing Co., Ltd., Hsinchu (TW)

(72) Inventors: Yu-Hung Cheng, Hsinchu (TW); Yong-En Syu, Hsinchu (TW); Kuo-Hwa Tzeng, Hsinchu (TW); Ke-Dian Wu, Hsinchu (TW); Cheng-Ta Wu, Hsinchu (TW); Yeur-Luen Tu, Hsinchu (TW); Ming-Che Yang, Hsinchu (TW); Wei-Kung Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/492,472

(22) Filed: Apr. 20, 2017

(65) Prior Publication Data

US 2018/0308928 A1 Oct. 25, 2018

(51) Int. Cl.
*H01L 29/06* (2006.01)
*H01L 29/78* (2006.01)
(Continued)

(52) U.S. Cl.
CPC ...... *H01L 29/0649* (2013.01); *H01L 21/0245* (2013.01); *H01L 21/0262* (2013.01);
(Continued)

(58) Field of Classification Search
CPC ......... H01L 29/66; H01L 29/06; H01L 21/02; H01L 21/31
(Continued)

(56) References Cited

U.S. PATENT DOCUMENTS

| 4,521,448 A * | 6/1985 | Sasaki ............... H01L 21/0338 257/E21.039 |
| 5,447,889 A * | 9/1995 | Sano ................... H01L 21/2022 438/795 |

(Continued)

OTHER PUBLICATIONS

Ali et al., "Ultrawide Frequency Range Crosstalk Into Standard and Trap-Rich High Resistivity Silicon Substrates", IEEE Transactions on Electron Devices, vol. 58, No. 12, Dec. 2011, pp. 4258-4264.
(Continued)

*Primary Examiner* — Sheng-Bai Zhu
(74) *Attorney, Agent, or Firm* — Birch, Stewart, Kolasch & Birch, LLP (57) ABSTRACT

Structures and formation methods of a semiconductor device structure are provided. The semiconductor device structure includes a supporting substrate. The semiconductor device structure also includes a first carrier-trapping layer covering the supporting substrate. The first carrier-trapping layer is doped with a group-IV dopant. The semiconductor device structure further includes an insulating layer covering the first carrier-trapping layer. In addition, the semiconductor device structure includes a semiconductor substrate over the insulating layer. The semiconductor device structure also includes a transistor. The transistor includes a gate stack over the semiconductor substrate and source and drain structures in the semiconductor substrate.

20 Claims, 10 Drawing Sheets

(51) Int. Cl.
*H01L 21/762* (2006.01)
*H01L 21/02* (2006.01)
*H01L 29/66* (2006.01)
*H01L 29/15* (2006.01)

(52) U.S. Cl.
CPC .. *H01L 21/02507* (2013.01); *H01L 21/02513* (2013.01); *H01L 21/02532* (2013.01); *H01L 21/02595* (2013.01); *H01L 21/76256* (2013.01); *H01L 29/0607* (2013.01); *H01L 29/158* (2013.01); *H01L 29/66477* (2013.01); *H01L 29/78* (2013.01); *H01L 29/7848* (2013.01)

(58) Field of Classification Search
USPC .......................................... 257/349; 438/198
See application file for complete search history.

(56) References Cited

U.S. PATENT DOCUMENTS

| | | | | |
|---|---|---|---|---|
| 5,648,290 | A * | 7/1997 | Yee | H01L 27/10817 257/E21.648 |
| 5,665,611 | A * | 9/1997 | Sandhu | H01L 27/1214 438/162 |
| 6,331,720 | B1 * | 12/2001 | Parekh | H01L 27/10817 257/303 |
| 2002/0025650 | A1 * | 2/2002 | Thakur | H01L 28/84 438/398 |
| 2004/0266078 | A1 * | 12/2004 | Kim | H01L 21/02532 438/166 |
| 2012/0001267 | A1 * | 1/2012 | Lee | H01L 21/28061 257/369 |
| 2016/0071959 | A1 * | 3/2016 | Thomas | H01L 29/4916 257/324 |
| 2016/0300729 | A1 * | 10/2016 | Goktepeli | H01L 29/78 |
| 2017/0005111 | A1 * | 1/2017 | Verma | H01L 27/1207 |
| 2017/0084478 | A1 * | 3/2017 | Nguyen | H01L 21/763 |
| 2017/0103913 | A1 * | 4/2017 | Dutartre | H01L 21/7624 |
| 2017/0330976 | A1 * | 11/2017 | Huang | H01L 29/792 |
| 2017/0331501 | A1 * | 11/2017 | Kononchuk | H04B 1/03 |

OTHER PUBLICATIONS

Kerr, et al., "Identification of RF harmonic distortion on Si substrates and its reduction using a trap-rich layer", 2008, IEEE, pp. 151-154.

Lederer, et al., "New Substrate Passivation Method Dedicated to HR SOI Wafer Fabrication With Increased Substrate Resistivity", IEEE Electron Device Letters, vol. 26, No. 11, Nov. 2005, pp. 805-807.

Lemeil et al., "Engineered substrates: The foundation to meet current and future RF requirements", 2015, IEEE, 4 pgs.

Neve, et al., "RF and linear performance of commercial 200 mm trap-rich HR-SOI wafers for SoC applications", SiRF, 2013, IEEE, pp. 15-17.

Raskin et al., "High Resistivity SOI wafer for mainstream RF System-on-Chip", SiRF, 2015, IEEE, pp. 33-36.

Raskin, "SOI technology pushes the limits of CMOS for RF applications", SiRF, 2016, IEEE, pp. 17-20.

Shim, et al., "RF MEMS Passives on High-Resistivity Silicon Substrates", IEEE Microwave and Wireless Components Letters, 2013, pp. 1-3.

* cited by examiner

SEMICONDUCTOR DEVICE STRUCTURE HAVING CARRIER-TRAPPING LAYERS WITH DIFFERENT GRAIN SIZES

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate. For example, the semiconductor substrate is a bulk substrate including a solid layer of semiconductor material. Alternatively, the semiconductor substrate is a silicon-on-insulator (SOI) substrate.

SOI substrates are substrates that have a silicon layer separated from an underlying handle wafer by an insulating layer. The insulating layer electrically isolates the silicon layer from the handle wafer. SOI technology is becoming increasingly important in the field of integrated circuit (IC) manufacturing and is widely used in high-performance and high-density ICs.

In the course of IC evolution, the complexity of processing and manufacturing ICs has increased. Therefore, SOI technology faces manufacturing challenges and has not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure form a semiconductor device structure with a silicon-on-insulator (SOI) substrate or a similar substrate. The SOI substrate is widely used for fabrication of high-performance and high-density ICs. For example, the SOI substrate is well-suited for radio frequency (RF) devices, such as RF switches or other suitable RF devices. However, embodiments of the disclosure are not limited and may be applied to any suitable semiconductor devices. The SOI substrate may be fabricated using a wafer bonding process, a silicon film transfer process, a separation by implantation process, another applicable method, or a combination thereof.

Some embodiments of the disclosure are described. FIGS. 1A-1F are cross-sectional views of various stages of a process for forming a semiconductor device structure, in accordance with some embodiments. Additional operations can be provided before, during, and/or after the stages described in FIGS. 1A-1F. Some of the stages that are described can be replaced or eliminated for different embodiments. Additional features can be added to the semiconductor device structure. Some of the features described below can be replaced or eliminated for different embodiments.

Figure 1A:
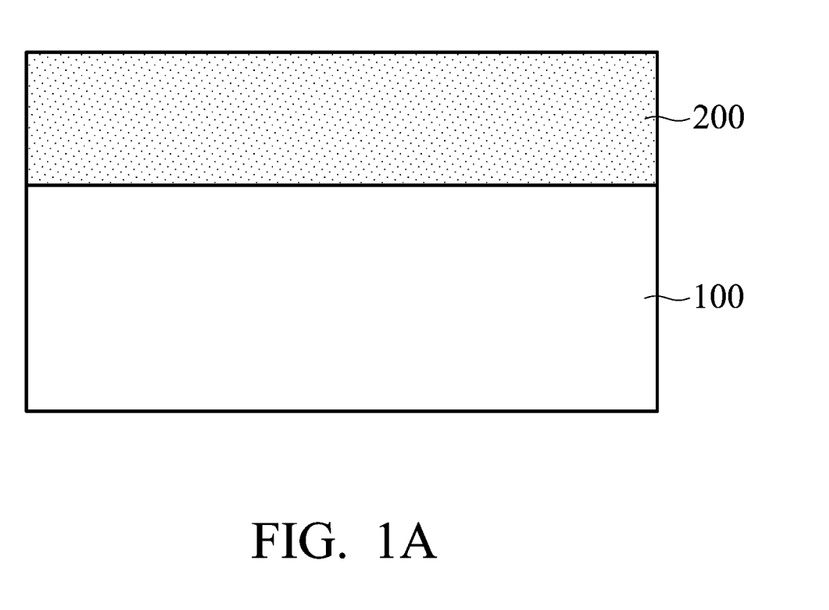
FIGS. 1A-1F are cross-sectional views of various stages of a process for forming a semiconductor device structure, in accordance with some embodiments.

As shown in FIG. 1A, a supporting substrate 100 is provided. The supporting substrate 100 may be referred to as a high-resistance substrate or a handle substrate. For example, the supporting substrate 100 may have a resistance in a range from about 5000 ohm-cm to about 15000 ohm-cm, but embodiments of the disclosure are not limited thereto. The supporting substrate 100 with a high resistance can meet application requirements, such as device-to-device isolation.

In some embodiments, the supporting substrate 100 is a bulk semiconductor substrate, such as a semiconductor wafer. In some embodiments, the supporting substrate 100 includes silicon or a silicon-containing material. For example, the supporting substrate 100 is a silicon wafer. However, embodiments of the disclosure are not limited thereto. In some other embodiments, the supporting substrate 100 includes another elementary semiconductor material (such as germanium) or a compound semiconductor. The compound semiconductor may include gallium arsenide, silicon carbide, indium arsenide, indium phosphide, another suitable compound semiconductor, or a combination thereof.

As shown in FIG. 1A, a carrier-trapping layer 200 is formed over the supporting substrate 100, in accordance with some embodiments. The carrier-trapping layer 200 may be referred to as a trap-rich layer or a high-resistance layer. Charge carriers (or free carriers) in the supporting substrate 100 are susceptible to movement caused by electric fields. The carrier-trapping layer 200 is configured to trap carriers between the supporting substrate 100 and an overlying insulating layer (such as an insulating layer 300 which will be described in more detail later). As a result, the carrier-trapping layer 200 mitigates or eliminates parasitic surface conduction (PSC) effect, which is induced by carriers between the supporting substrate 100 and the overlying insulating layer. Accordingly, the semiconductor device structure is prevented from device cross-talk and/or nonlinear distortions into radio frequency (RF) signals due to PSC effect.

In some embodiments, the carrier-trapping layer 200 includes a material capable of catching carriers, such as a polycrystalline material or another suitable material. For example, the supporting substrate 100 includes polycrystalline silicon (polysilicon for short) or a polysilicon-containing material. In some embodiments, the carrier-trapping layer 200 has grains. The grains have a grain size in a range from about 10 nm to about 100 nm, but embodiments of the disclosure are not limited thereto. In some embodiments, the thickness of the carrier-trapping layer 200 is equal to or greater than about 1 μm, but embodiments of the disclosure are not limited thereto.

In some embodiments, a polycrystalline material is epitaxially grown over the supporting substrate 100. The polycrystalline material is growing continually to form the carrier-trapping layer 200. In some embodiments, the carrier-trapping layer 200 is grown using a chemical vapor deposition (CVD) process, an epitaxy growth process, a molecular beam epitaxy (MBE) process, deposition of doped amorphous semiconductor (e.g. silicon) followed by a solid-phase epitaxial recrystallization (SPER) step, another applicable process, or a combination thereof. Examples of the CVD process include a low pressure CVD (LPCVD) process, a plasma enhanced chemical vapor deposition (PECVD), and an ultra-high vacuum CVD (UHV-CVD) process). The growth process of the carrier-trapping layer 200 may use gaseous precursors and/or liquid precursors. For example, the precursors for growing the carrier-trapping layer 200 may include silane ($SiH_4$), another suitable material, or a combination thereof.

In some embodiments, the carrier-trapping layer 200 is grown at a temperature in a range from about 500° C. to about 1000° C. The carrier-trapping layer 200 may be grown at high pressure and high flow rate. In some embodiments, the carrier-trapping layer 200 is grown at an atmosphere containing nitrogen gas, hydrogen gas, or another suitable gas. For example, the carrier-trapping layer 200 may be grown in a furnace with a nitrogen gas atmosphere or a deposition process chamber with a hydrogen gas atmosphere.

In accordance with some embodiments, the carrier-trapping layer 200 is doped with one or more suitable dopants (or impurities). The dopants in the carrier-trapping layer 200 are group-IV dopants. For example, the carrier-trapping layer 200 is doped with carbon, germanium, or a combination thereof. In some embodiments, the doping concentration (or impurity concentration) of the carrier-trapping layer 200 is in a range from about 0.1 atomic percentage (at. %) to about 5 at. %. For example, carbon dopants in the carrier-trapping layer 200 may be in a range from about 0.1 at. % to about 1 at. %. Germanium dopants in the carrier-trapping layer 200 may be in a range from about 1 at. % to about 5 at. %. However, embodiments of the disclosure are not limited thereto. The doping concentration of the carrier-trapping layer 200 can vary according to requirements.

In some embodiments, the carrier-trapping layer 200 is in-situ doped during the growth of the carrier-trapping layer 200. In some embodiments, the precursors used in the growth process of the carrier-trapping layer 200 include a compound material containing carbon, germanium, or a combination thereof to provide dopants. For example, the precursors used in the growth process of the carrier-trapping layer 200 may include monomethyl silane ($CH_4SiH_3$, MMS), $C_xH_y$ ($0<x\leq10$, $2\leq y\leq22$), monogermane ($GeH_4$), another suitable material, or a combination thereof. In some embodiments, atoms of dopants (such as C or Ge) react with Si to form the polycrystalline material of the carrier-trapping layer 200. As a result, the atoms of dopants are incorporated in the crystal lattice of the polycrystalline material. The dopants in the carrier-trapping layer 200 may be referred to as active dopants.

Many variations and/or modifications can be made to embodiments of the disclosure. In some other embodiments, the carrier-trapping layer 200 is ex-situ doped. That is, the carrier-trapping layer 200 is not doped during the growth of the carrier-trapping layer 200. The carrier-trapping layer 200 is doped in a subsequent process. In some embodiments, the carrier-trapping layer 200 is doped using an ion implantation process, a plasma immersion ion implantation process, a gas and/or solid source diffusion process, another applicable process, or a combination thereof. In some embodiments, the carrier-trapping layer 200 is further exposed to annealing processes to activate the dopants. For example, a rapid thermal annealing (RTA) process is performed.

Figure 1B:
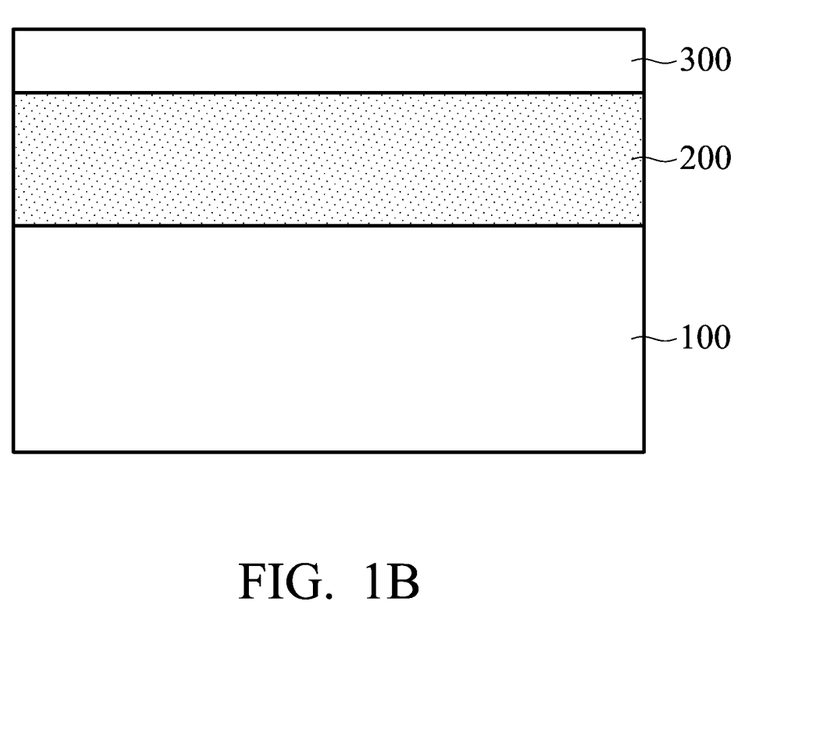

As shown in FIG. 1B, an insulating layer 300 is formed over the carrier-trapping layer 200, in accordance with some embodiments. In some embodiments, the carrier-trapping layer 200 is in direct contact with the insulating layer 300 and the supporting substrate 100.

The insulating layer 300 includes an insulating or dielectric material. In some embodiments, the insulating layer 300 includes an oxide (such as silicon oxide), boron phosphorus silicate glass (BPSG), another suitable material, or a combination thereof. In some embodiments, the insulating layer 300 is deposited using a CVD process, a thermal oxidation process, a spin-on process, an ALD process, a PVD process, another applicable process, or a combination thereof. When the insulating layer 300 is formed using a thermal oxidation process, the top surface of the carrier-trapping layer 200 may be consumed and covered by the insulating layer 300. In some embodiments, the grains in the carrier-trapping layer 200 maintain substantially the same size during the formation of the insulating layer 300.

Figure 1C:
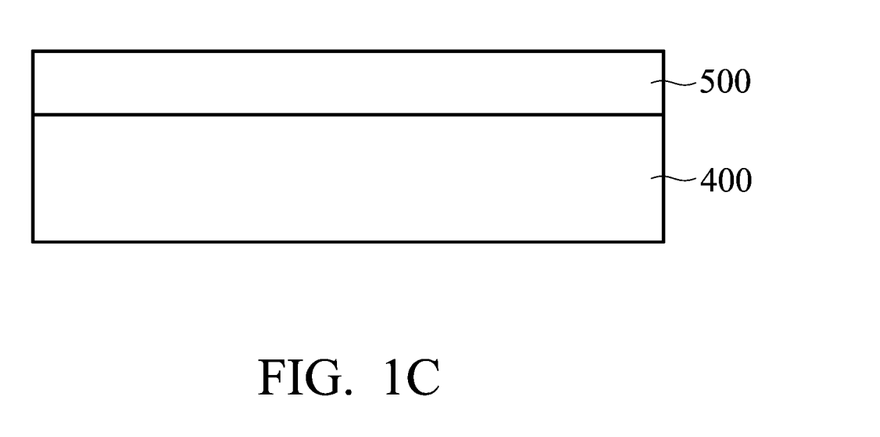

As shown in FIG. 1C, a semiconductor substrate 400 is provided. In some embodiments, the semiconductor substrate 400 is epitaxially grown over a supporting substrate (not shown). In some other embodiments, the semiconductor substrate 400 is a bulk semiconductor substrate, such as a semiconductor wafer. In some embodiments, the semiconductor substrate 400 includes an elementary or compound semiconductor material. For example, the semiconductor substrate 400 may include silicon, germanium, silicon germanium, another suitable semiconductor material, or a combination thereof. In some embodiments, the semiconductor substrate 400 includes a single crystalline material.

As shown in FIG. 1C, an insulating layer 500 is formed over the semiconductor substrate 400, in accordance with some embodiments. The insulating layer 500 includes an insulating or dielectric material. In some embodiments, the insulating layer 500 includes an oxide (such as silicon oxide), BPSG, another suitable material, or a combination thereof. In some embodiments, the insulating layer 500 is deposited using a CVD process, a thermal oxidation process, a spin-on process, an ALD process, a PVD process, another applicable process, or a combination thereof. When the insulating layer 500 is formed using a thermal oxidation process, the surfaces of the semiconductor substrate 400 may be covered by the insulating layer 500.

Figure 1D:
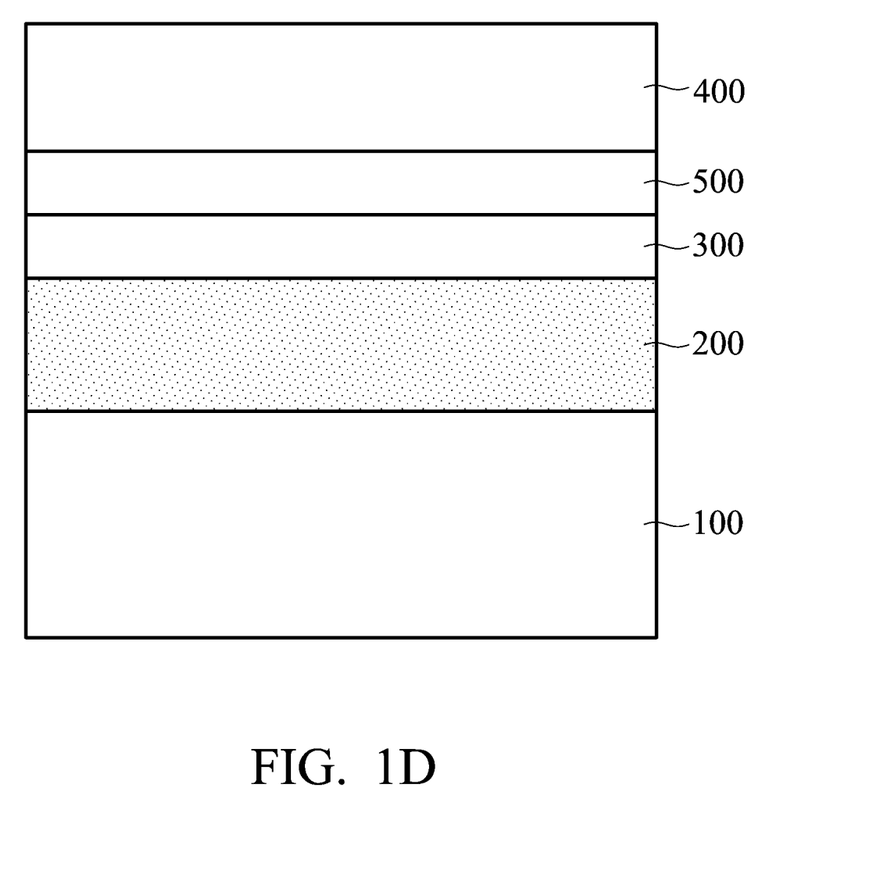

As shown in FIG. 1D, the semiconductor substrate 400 and the insulating layer 500 are turned upside down and placed over the structure shown in FIG. 1B, in accordance with some embodiments. Afterwards, a bonding process is performed to bond the semiconductor substrate 400 and the insulating layer 500 to the insulating layer 300. In some embodiments, a thermal treatment (such as an annealing process) is performed to strengthen the bond attachment. In some embodiments, a cleaning process is performed over the insulating layer 500 and the insulating layer 300 before the bonding process.

The combination of the insulating layer 500 and the insulating layer 300 may be referred to as a buried layer, such as a buried oxide (BOX) layer. The insulating layer 500 and the insulating layer 300 electrically isolate the semiconductor substrate 400 from the supporting substrate 100 and the carrier-trapping layer 200. As a result, current leakage of features, which are formed within the semiconductor substrate 400, is reduced or eliminated.

Figure 1E:
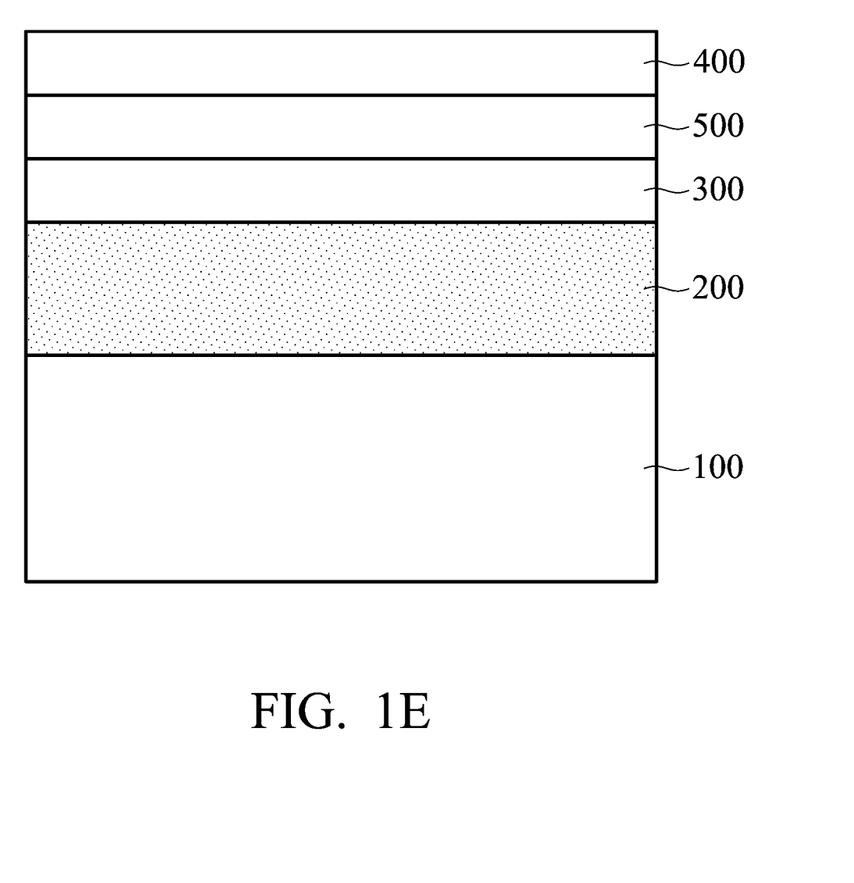

As shown in FIG. 1E, the semiconductor substrate 400 is thinned, in accordance with some embodiments. The upper portion of the semiconductor substrate 400 is removed. As a result, a SOI substrate is formed, in accordance with some embodiments. For example, an etching process may be performed. The upper portion of the semiconductor substrate 400 may be removed using an etchant, such as an acid etching solution.

Many variations and/or modifications can be made to embodiments of the disclosure. The formation of the SOI substrate may include any applicable method, such as hydrogen ion implantation separation method, separation by implantation of oxygen (SIMOX) method, or another suitable process. For example, in some other embodiments, an ion-implantation process is performed over the semiconductor substrate 400 before the bonding of the insulating layer 500 and the insulating layer 300. Ions are implanted into the semiconductor substrate 400 at a predetermined depth. As a result, the semiconductor substrate 400 is divided into a first layer and a second layer. The first layer adjoins the insulating layer 500 while the second layer is separated from the insulating layer 500 by the first layer. After the bonding of the insulating layer 500 and the insulating layer 300, the second layer of the semiconductor substrate 400 is split and removed. The second layer of the semiconductor substrate 400 may be removed by mechanical cleaving or thermal cleaving (such as an annealing process).

In some embodiments, the grains in the carrier-trapping layer 200 maintain substantially the same size during the bonding process. Afterwards, an additional process is performed to planarize and smooth the surface of the semiconductor substrate 400. The additional process may include a chemical mechanical polishing (CMP) process, a grinding process, an etching process, another applicable process, or a combination thereof.

Multiple active elements will be formed in and on the semiconductor substrate 400. Passive elements may also be formed on the semiconductor substrate 400. The semiconductor substrate 400 is used to provide faster switching times and lower operating voltages, which make the semiconductor device structure suitable for RF devices.

Figure 1F:
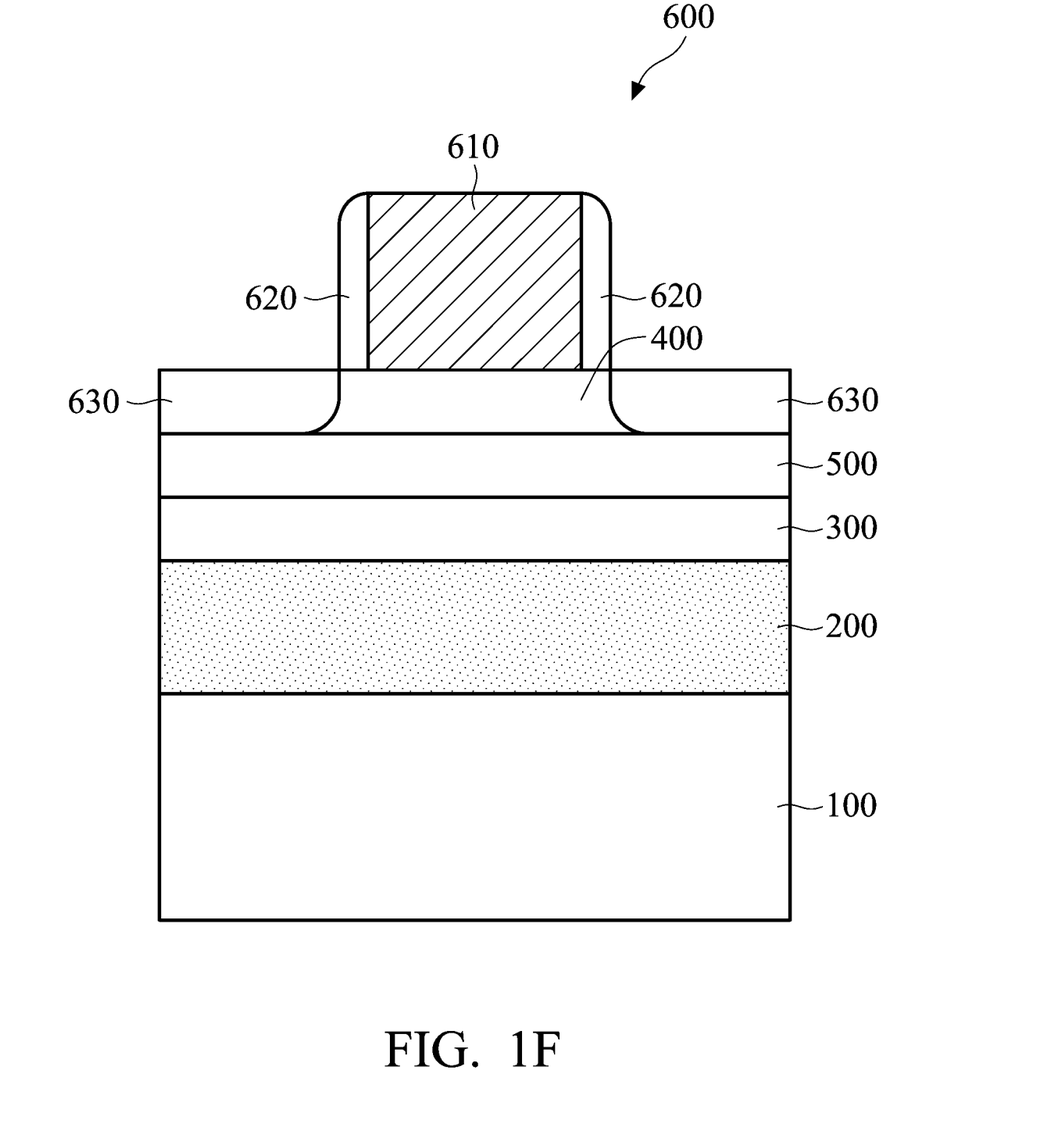

As shown in FIG. 1F, an active element 600 is formed in and/or over the semiconductor substrate 400, in accordance with some embodiments. Examples of the active element 600 include a transistor, a diode, another suitable element, and a combination thereof. For example, the active element 600 may be a metal oxide semiconductor field effect transistor (MOSFET), a complementary metal oxide semiconductor (CMOS) transistor, a bipolar junction transistor (BJT), a high-voltage transistor, a high-frequency transistor, a p-channel and/or n-channel field effect transistor (PFETs/NFETs), etc. Various processes are performed to form the active element 600, such as front-end-of-line (FEOL) semiconductor fabrication processes. FEOL semiconductor fabrication processes include deposition, etching, implantation, photolithography, annealing, planarization, another applicable process, and combinations thereof. In some embodiments, the grains in the carrier-trapping layer 200 maintain substantially the same size during the formation of the active element 600 (or FEOL semiconductor fabrication processes).

For example, in some embodiments, the active element 600 is a transistor including a gate stack 610, spacer elements 620, and source and drain structures 630. The gate stack 610 is formed over the semiconductor substrate 400. In some embodiments, the gate stack 610 includes a gate dielectric layer (not shown) and a gate electrode over the gate dielectric layer (not shown). In some embodiments, the gate dielectric layer is made of a high-K dielectric material. Examples of high-K dielectric materials include hafnium oxide, zirconium oxide, aluminum oxide, silicon oxynitride, another suitable high-K material, and combinations thereof. In some embodiments, the gate electrode includes polysilicon, a metal material, another suitable conductive material, or a combination thereof. The gate stack 610 may be a sacrificial or dummy gate stack, which will be replaced with a metal gate stack.

The spacer elements 620 are formed over the semiconductor substrate 400 and cover sidewalls of the gate stack 610. In some embodiments, the spacer elements 620 are made of silicon nitride, silicon oxynitride, silicon carbide, silicon oxycarbide, another suitable material, or a combination thereof. In some embodiments, a spacer layer is deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the gate stacks 610 form the spacer elements 620.

The source and drain structures 630 are formed in the semiconductor substrate 400 and on opposite sides of the gate stacks 610. The source and drain structures 630 may be used to provide stress or strain to channel regions in the semiconductor substrate 400 below the gate stack 610. As a result, the carrier mobility of the device and device performance are improved. In some embodiments, one or multiple implantation processes are performed over the semiconductor substrate 400 so as to form the source and drain structures 630. In some embodiments, the source and drain structures 630 are doped with one or more N-type or P-type dopants. The dopants in the source and drain structures 630 may include phosphorus (P), arsenic (As), boron (B) or other suitable dopants. In some embodiments, the dopants in the source and drain structures 630 are different from the dopants in the carrier-trapping layer 200.

Embodiments of the disclosure are not limited thereto. In some other embodiments, the source and drain structures 630 include epitaxial structures. The semiconductor substrate 400 may be partially removed to form recesses positioned at locations where the source and drain structures 630 will be formed. Afterwards, a semiconductor material is epitaxially grown in the recesses so as to form the source and drain structures 630. In some embodiments, the source and drain structures 630 include a P-type or N-type semiconductor material. For example, the source structures 630 may include epitaxially grown silicon, silicon-germanium (SiGe), epitaxially grown phosphorous-doped silicon (SiP), boron-doped silicon germanium (SiGeB) or another suitable epitaxially grown semiconductor material.

Many variations and/or modifications can be made to embodiments of the disclosure. In some other embodiments, isolation features (not shown) are formed in the semiconductor substrate 400 before the formation of the active element 600. The isolation features are used to define and electrically isolate various device elements formed in and/or over the semiconductor substrate 400. In some embodiments, the isolation features include shallow trench isolation (STI) features, local oxidation of silicon (LOCOS) features, other suitable isolation features, or a combination thereof.

Subsequently, various processes, such as back-end-of-line (BEOL) semiconductor fabrication processes, will be performed to form various features over the semiconductor substrate 400 and the active element 600. Some of the various features are electrically connected to the active element 600. In some embodiments, the grains in the carrier-trapping layer 200 maintain substantially the same size during BEOL semiconductor fabrication processes.

Embodiments of the disclosure can be applied to not only a planar semiconductor device structure but also a semiconductor device structure with a fin field-effect transistor (FinFET) or another suitable semiconductor device structure. Furthermore, embodiments of the disclosure are not limited and may be applied to fabrication processes for any suitable technology generation.

In some cases, a trap-rich layer of a SOI substrate has thermal instability. For example, high-temperature processes may affect the polycrystalline structure of the trap-rich layer. More specifically, when a non-doped trap-rich layer undergoes high-temperature processes, the grains in the trap-rich layer may grow and be enlarged. As a result, the number of trap in the trap-rich layer is reduced. The trapping properties of the trap-rich layer may be degraded.

In accordance with some embodiments, the carrier-trapping layer 200 is doped with group-IV dopants, either in-situ or ex-situ. The dopants provide the carrier-trapping layer 200 with thermal stability. More specifically, when the carrier-trapping layer 200 containing dopants undergoes high-temperature processes, the dopants mitigate or suppress the growth of the grains in the carrier-trapping layer 200. It can be ensured that the carrier-trapping layer 200 has smaller grains and a sufficiently high density of traps. As a result, the trapping properties of the carrier-trapping layer 200 are prevented from being degraded. The carrier-trapping layer 200 can trap more carriers so as to eliminate PSC effect and prevent cross-talk and/or nonlinear distortions. Therefore, the SOI substrate can have a sufficiently high resistance. The device performance of the semiconductor device structure is significantly enhanced.

Furthermore, in some cases, additional elements (such as boron elements or other elements) are left after various fabrication processes (such as implantation processes, etching processes, cleaning processes, or other processes). These additional elements are susceptible to movement and diffusion during high-temperature processes. As a result, the additional elements may be piled up at interfaces between layers of a SOI substrate. Since the additional elements have electrical conductivity, the resistance of a SOI substrate is partially reduced.

In accordance with some embodiments, the dopants in the carrier-trapping layer 200 block boron elements. The dopants retard and suppress the accumulation of boron elements at interfaces between the carrier-trapping layer 200 and the supporting substrate 100 and/or between the carrier-trapping layer 200 and the insulating layer 300. Accordingly, it can be ensured that the SOI substrate has a sufficiently high resistance to meets the requirements on RF devices, such as high-performance RF devices (>1 GHz RF signal).

As mentioned above, in some embodiments, the doping concentration of the carrier-trapping layer 200 is in a range from about 0.1 at. % to about 5 at. %. In some cases, the doping concentration of the carrier-trapping layer 200 should be greater than about 0.1 at. % or 1 at. %. If the doping concentration of the carrier-trapping layer 200 is substantially the same as or less than about 0.1 at. % or 1 at. %, the carrier-trapping layer 200 may not have enough thermal stability. The grains in the carrier-trapping layer 200 may be slightly grown during high-temperature processes. As a result, the resistance of the SOI substrate may not be improved. However, embodiments of the disclosure are not limited thereto. In some other cases, the doping concentration of the carrier-trapping layer 200 may be substantially the same as or less than about 1 at. %, such as about 0.1 at. %.

In some cases, the doping concentration of the carrier-trapping layer 200 should not be greater than about 5 at. %. If the doping concentration of the carrier-trapping layer 200 is greater than about 5 at. %, the carrier-trapping layer 200 may become unstable. For example, if germanium dopants in the carrier-trapping layer 200 have a concentration greater than about 5 at. %, the melting point of the carrier-trapping layer 200 is reduced. The carrier-trapping layer 200 may become susceptible to melting. However, embodiments of the disclosure are not limited thereto. In some other cases, the doping concentration of the carrier-trapping layer 200 may be greater than about 5 at. %.

Many variations and/or modifications can be made to embodiments of the disclosure. For example, although FIGS. 1A-1F show that a semiconductor device structure includes one carrier-trapping layer, embodiments of the disclosure are not limited thereto. In some other embodiments, a semiconductor device structure includes multiple carrier-trapping layers.

FIGS. 2A-2D are cross-sectional views of various stages of a process for forming a semiconductor device structure, in accordance with some embodiments. In some embodiments, the materials and/or formation methods of the semiconductor device structure shown in FIGS. 1A-1F can also be applied in the embodiments illustrated in FIGS. 2A-2D, and are therefore not repeated.

Figure 2A:
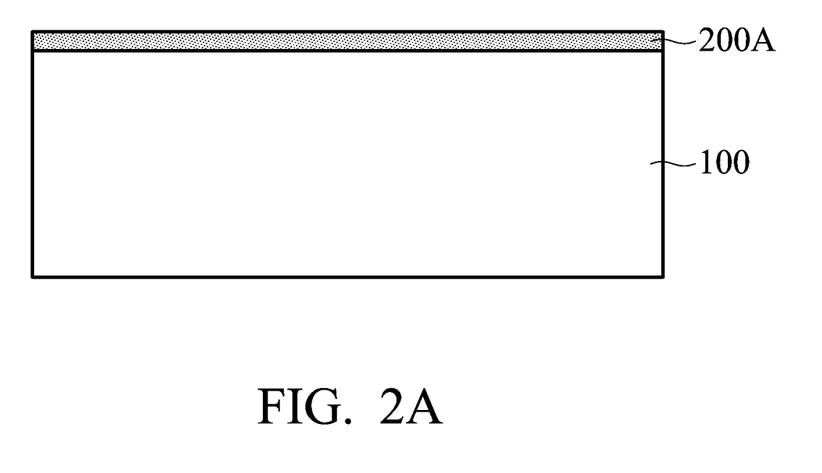
FIGS. 2A-2D are cross-sectional views of various stages of a process for forming a semiconductor device structure, in accordance with some embodiments.

As shown in FIG. 2A, a carrier-trapping layer 200A is grown over the supporting substrate 100, in accordance with some embodiments. The materials and/or formation methods of the carrier-trapping layer 200A may be similar to or substantially the same as those of the carrier-trapping layer 200.

In some embodiments, the carrier-trapping layer 200A has grains in a range from about 10 nm to about 20 nm, but embodiments of the disclosure are not limited thereto. In some embodiments, the thickness of the carrier-trapping layer 200A is in a range from about 20 nm to about 100 nm, but embodiments of the disclosure are not limited thereto. In some embodiments, the carrier-trapping layer 200A is grown at a temperature in a range from about 500° C. to about 700° C.

In some embodiments, the carrier-trapping layer 200A is doped with one or more suitable dopants. The dopants in the carrier-trapping layer 200A are group-IV dopants. For example, the carrier-trapping layer 200A is doped with carbon, germanium, or a combination thereof. In some embodiments, the doping concentration of the carrier-trapping layer 200A is in a range from about 0.1 at. % to about 5 at. %. In some embodiments, the carrier-trapping layer 200A is in-situ doped during the growth of the carrier-trapping layer 200A. In some other embodiments, the carrier-trapping layer 200A is ex-situ doped. Embodiments of the disclosure are not limited. In some other embodiments, the carrier-trapping layer 200A is not doped.

Figure 2B:
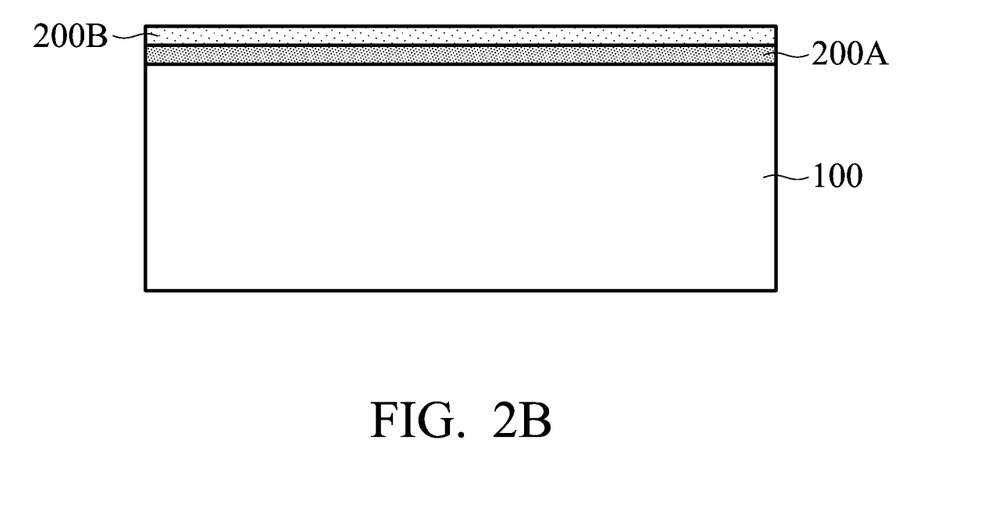

As shown in FIG. 2B, a carrier-trapping layer 200B is grown over the carrier-trapping layer 200A, in accordance with some embodiments. In some embodiments, the carrier-trapping layer 200A is sandwiched between the carrier-trapping layer 200B and the supporting substrate 100. The materials and/or formation methods of the carrier-trapping layer 200B may be similar to or substantially the same as those of the carrier-trapping layer 200.

In some embodiments, the carrier-trapping layer 200B has grains in a range from about 20 nm to about 100 nm, but embodiments of the disclosure are not limited thereto. In some embodiments, the thickness of the carrier-trapping layer 200B is in a range from about 100 nm to about 300 nm. However, embodiments of the disclosure are not limited thereto. The carrier-trapping layer 200B may be thinner than the carrier-trapping layer 200A. In some embodiments, the carrier-trapping layer 200B is grown at a temperature in a range from about 700° C. to about 1000° C.

In some embodiments, the carrier-trapping layer 200B is doped with one or more suitable dopants. The dopants in the carrier-trapping layer 200B are group-IV dopants. For example, the carrier-trapping layer 200B is doped with carbon, germanium, or a combination thereof. In some embodiments, the dopants in the carrier-trapping layer 200B are the same as those in the carrier-trapping layer 200A. In some other embodiments, the dopants in the carrier-trapping layer 200B are different from those in the carrier-trapping layer 200A. In some embodiments, the doping concentration of the carrier-trapping layer 200B is in a range from about 0.1 at. % to about 5 at. %. The doping concentration of the carrier-trapping layer 200B may be or may not be the same as the doping concentration of the carrier-trapping layer 200A.

In some embodiments, the carrier-trapping layer 200B is in-situ doped during the growth of the carrier-trapping layer 200B. In some other embodiments, the carrier-trapping layer 200B is ex-situ doped. In some other embodiments, the carrier-trapping layer 200B is not doped.

Many variations and/or modifications can be made to embodiments of the disclosure. In some embodiments, the carrier-trapping layer 200A and the carrier-trapping layer 200B are doped with group-IV dopants. In some other embodiments, one of the carrier-trapping layer 200A and the carrier-trapping layer 200B is doped with group-IV dopants while other of the carrier-trapping layer 200A and the carrier-trapping layer 200B is not doped. In some other embodiments, the carrier-trapping layer 200B and the carrier-trapping layer 200A are substantially free of dopants.

Many variations and/or modifications can be made to embodiments of the disclosure. In some embodiments, the carrier-trapping layer 200A and the carrier-trapping layer 200B include a polycrystalline material. In some other embodiments, one of the carrier-trapping layer 200A and the carrier-trapping layer 200B includes a polycrystalline material while other of the carrier-trapping layer 200A and the carrier-trapping layer 200B includes an amorphous material or an amorphous-like material. The amorphous material may be substantially free of grain. The amorphous-like material may include grains having a grain size that is less than about 5 nm, but embodiments of the disclosure are not limited thereto. The amorphous carrier-trapping layer is grown at a temperature in a range from about 300° C. to about 550° C.

Figure 2C:
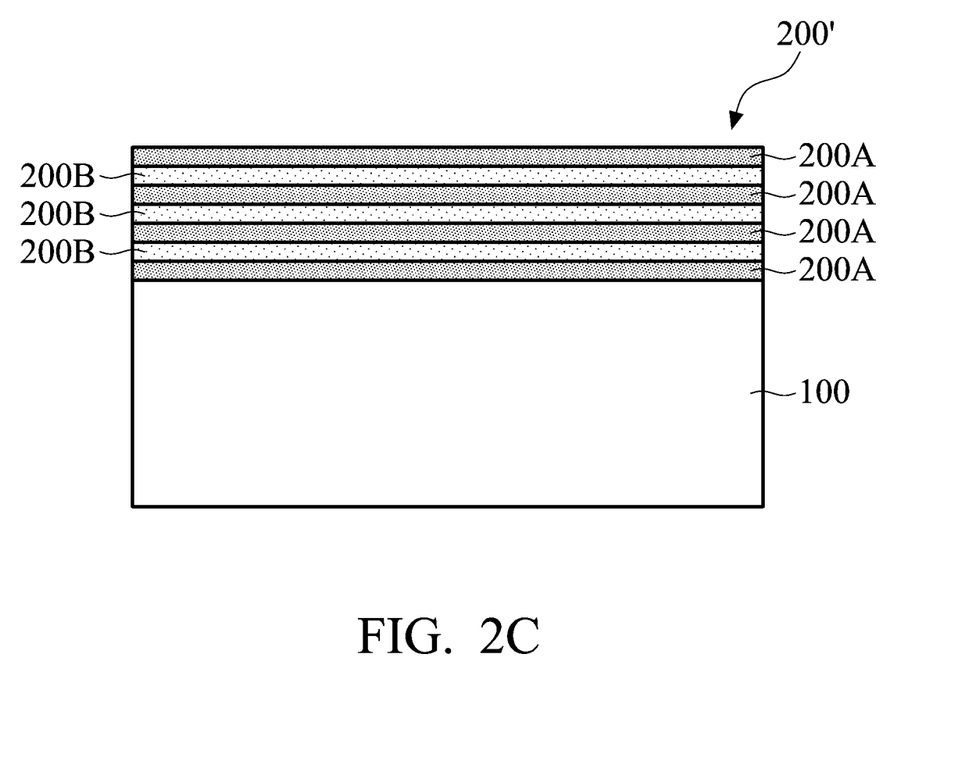

As shown in FIG. 2C, more carrier-trapping layers 200A and 200B are alternately grown over the supporting substrate 100, in accordance with some embodiments. As a result, a carrier-trapping stack layer 200' is formed. Although FIG. 2C shows that the carrier-trapping stack layer 200' includes four carrier-trapping layers 200A and three carrier-trapping layers 200B, embodiments of the disclosure are not limited thereto. In some other embodiments, the carrier-trapping stack layer 200' includes fewer or more than four carrier-trapping layers 200A and fewer or more than three carrier-trapping layers 200B. For example, the carrier-trapping stack layer 200' may include three carrier-trapping layers 200A and 200B, which are alternately stacked over the supporting substrate 100. The carrier-trapping stack layer 200' may include one carrier-trapping layer 200B between two carrier-trapping layers 200A or one carrier-trapping layer 200A between two carrier-trapping layers 200B.

As mentioned above, in some embodiments, one of the carrier-trapping layers 200A and 200B includes an amorphous material or an amorphous-like material. Grains may be formed in the amorphous material after various fabrication processes. Alternatively, the amorphous-like material may include enlarged grains or even become a polycrystalline material after various fabrication processes. In some embodiments, the amorphous material of the carrier-trapping layers 200A or 200B is doped with group-IV dopants, such as carbon, germanium, or a combination thereof. The dopants in the amorphous material mitigate or suppress the growth of grains in the amorphous or amorphous-like material.

Figure 2D:
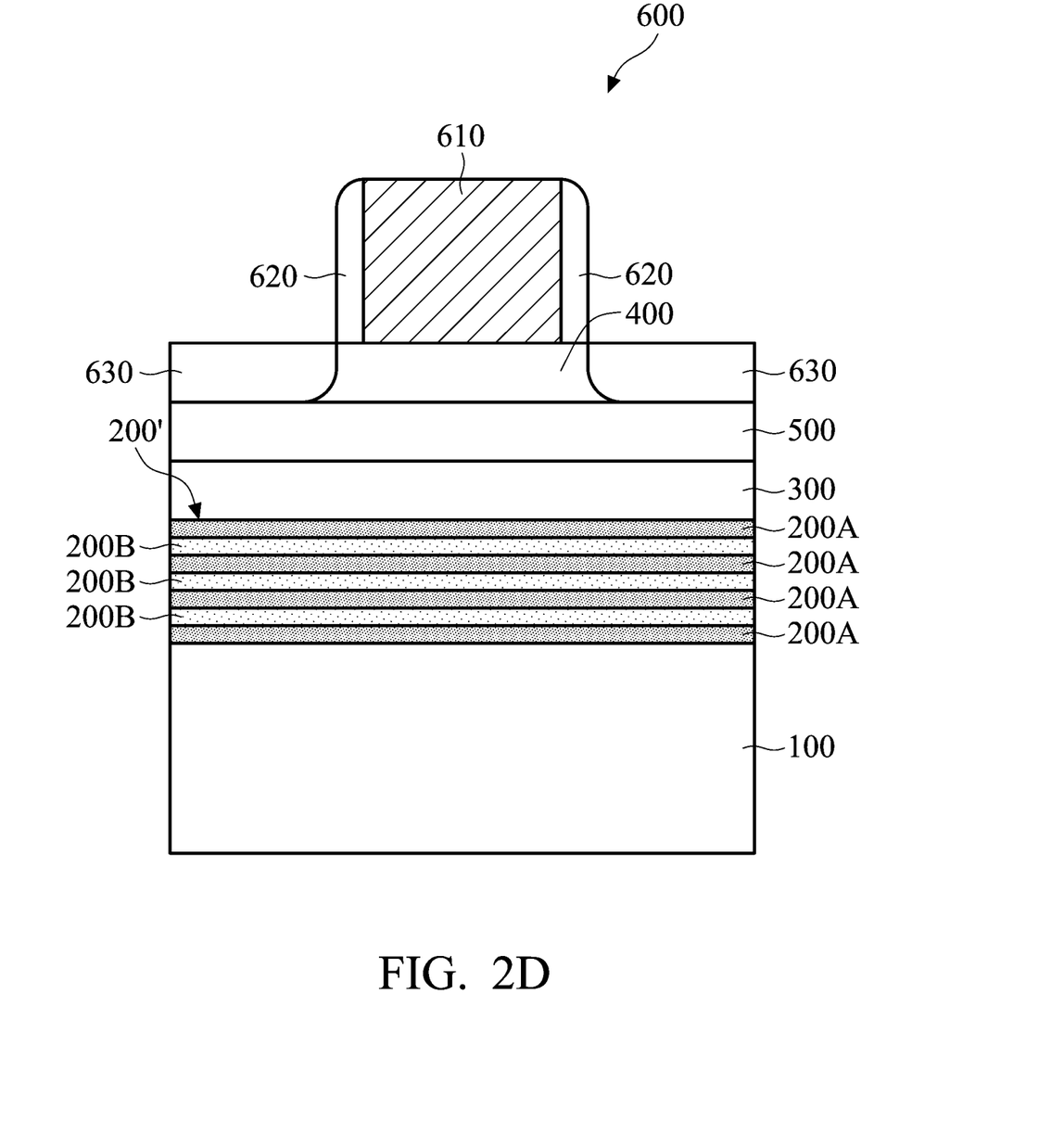

Afterwards, the steps described in FIGS. 1B-1F are sequentially performed over the structure shown in FIG. 2C to continue the formation of the semiconductor device structure, as shown in FIG. 2D. For example, the insulating layer 300 is formed over the topmost carrier-trapping layer 200A. When the insulating layer 300 is formed using a thermal oxidation process, the surface of the topmost carrier-trapping layer 200A may be consumed. In these embodiments, the topmost carrier-trapping layer 200A is not doped.

In accordance with some embodiments, the semiconductor device structure includes a carrier-trapping stack layer 200' includes multiple carrier-trapping layers 200A and 200B. The carrier-trapping stack layer 200' may be non-doped. In some embodiments, the carrier-trapping layers 200A and 200B include a polycrystalline material having grains of different sizes. For example, the grains in the carrier-trapping layers 200B are larger than those in the carrier-trapping layers 200A. The smaller grains can be used as a barrier to restrain the growth of the larger grains during high-temperature processes. In some other embodiments, one of the carrier-trapping layers 200A and 200B includes an amorphous or amorphous-like material, the amorphous or amorphous-like material can also be used as a barrier to restrain the growth of the larger grains. As a result, the trapping properties of the carrier-trapping stack layer 200' are improved and strengthened. The accumulation of boron elements at the interfaces between the carrier-trapping stack layer 200' and the supporting substrate 100 and/or between the carrier-trapping stack layer 200' and the insulating layer 300 is forbidden as well.

In accordance with some embodiments, the carrier-trapping stack layer 200' is further doped with group-IV dopants, such as carbon, germanium, or a combination thereof. In some embodiments, only the carrier-trapping layers 200A or the carrier-trapping layers 200B are doped. In some embodiments, all of the carrier-trapping layers 200A and 200B are doped. The dopants control the size of grains in the carrier-trapping stack layer 200' and greatly retard the growth of grains in the carrier-trapping stack layer 200'. It can be ensured that the carrier-trapping stack layer 200' has sufficiently strong trapping properties. Therefore, the SOI substrate can have a higher resistance. The device performance of the semiconductor device structure is enhanced even further.

Embodiments of the disclosure form a semiconductor device structure having a SOI substrate or a similar substrate. The semiconductor device structure includes a trap-rich layer doped with dopants. The dopants suppress the growth of grains in the trap-rich layer during high-temperature processes. It can be ensured that the trap-rich layer has smaller grains and a sufficiently high density of traps. As a result, the trapping properties of the trap-rich layer are prevented from being reduced. The dopants also retard the accumulation of boron elements in the SOI substrate. Accordingly, it can be ensured that the SOI substrate has a sufficiently high resistance to meets the requirements on high-performance RF devices.

In addition, the semiconductor device structure may include multiple trap-rich layers. One of the trap-rich layers contains smaller grains than other two trap-rich layers. These smaller grains restrain the growth of larger grains during high-temperature processes. One or more of the trap-rich layers can be doped with dopants to further suppress the growth of grains. Therefore, the device performance of the semiconductor device structure is significantly improved.

In accordance with some embodiments, a semiconductor device structure is provided. The semiconductor device structure includes a supporting substrate. The semiconductor device structure also includes a first carrier-trapping layer covering the supporting substrate. The first carrier-trapping layer is doped with a group-IV dopant. The semiconductor device structure further includes an insulating layer covering the first carrier-trapping layer. In addition, the semiconductor device structure includes a semiconductor substrate over the insulating layer. The semiconductor device structure also includes a transistor. The transistor includes a gate stack over the semiconductor substrate and source and drain structures in the semiconductor substrate.

In accordance with some embodiments, a semiconductor device structure is provided. The semiconductor device structure includes a supporting substrate. The semiconductor device structure also includes a carrier-trapping stack layer. The carrier-trapping stack layer includes a first polycrystalline layer over the supporting substrate, a second polycrystalline layer covering the first polycrystalline layer, and a third polycrystalline layer covering the second polycrystalline layer. The grain size of the second polycrystalline layer is less than the grain size of the first and third polycrystalline layers. The semiconductor device structure further includes an insulating layer covering the carrier-trapping stack layer. In addition, the semiconductor device structure includes a semiconductor substrate over the insulating layer. The semiconductor device structure also includes an active element over the semiconductor substrate.

In accordance with some embodiments, a method for forming a semiconductor device structure is provided. The method includes growing a first polycrystalline layer over a supporting substrate. The first polycrystalline layer is doped with a group-IV dopant. The method also includes forming an insulating layer over the first polycrystalline layer. The method further includes bonding a semiconductor substrate to the insulating layer. In addition, the method includes thinning the semiconductor substrate. The method also includes forming a gate stack over the semiconductor substrate. The method further includes forming source and drain structures in the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a supporting substrate;
a first carrier-trapping layer above and in contact with the supporting substrate, wherein the first carrier-trapping layer is doped with a group-IV dopant;
a second carrier-trapping layer above and in contact with the first carrier-trapping layer;
a third carrier-trapping layer above and in contact with the second carrier-trapping layer;
a fourth carrier-trapping layer above and in contact with the third carrier-trapping layer, wherein the first, second, third, and fourth carrier-trapping layers comprise polysilicon, and wherein grain sizes of the second carrier-trapping layer and the fourth carrier-trapping layer are larger than grain sizes of the first carrier-trapping layer and the third carrier-trapping layer;
an insulating layer covering and above the fourth carrier-trapping layer;
a semiconductor substrate over the insulating layer; and
a transistor comprising a gate stack over the semiconductor substrate and source and drain structures in the semiconductor substrate.

2. The semiconductor device structure as claimed in claim 1, wherein the group-IV dopant comprises carbon, germanium, or a combination thereof.

3. The semiconductor device structure as claimed in claim 1, wherein the insulating layer is in contact with the fourth-trapping layer.

4. The semiconductor device structure as claimed in claim 1, wherein the second carrier-trapping layer is doped with the group-IV dopant.

5. The semiconductor device structure as claimed in claim 1, wherein the first, second and third carrier-trapping layers are doped with the group-IV dopant.

6. The semiconductor device structure as claimed in claim 1, wherein the third carrier-trapping layer is doped with the group-IV dopant.

7. A semiconductor device structure, comprising:
a supporting substrate;
a carrier-trapping stack layer, comprising:
a first polycrystalline layer above and in contact with supporting substrate;
a second polycrystalline layer above and in contact with the first polycrystalline layer;
a third polycrystalline layer above and in contact with the second polycrystalline layer; and a fourth polycrystalline layer above and in contact with the third polycrystalline layer, wherein grain sizes of the second and the fourth polycrystalline layers are larger than grain sizes of the first and third polycrystalline layers, and wherein the first, second, third and fourth carrier-trapping layers are all doped or all undoped, or the first and third carrier-trapping layers are doped and the second and fourth carrier-trapping layers are undoped;

an insulating layer covering and above the carrier-trapping stack layer;

a semiconductor substrate above the insulating layer; and an active element above the semiconductor substrate.

8. The semiconductor device structure as claimed in claim 7, wherein the first, second and third polycrystalline layers comprise silicon doped with carbon, germanium, or a combination thereof.

9. The semiconductor device structure as claimed in claim 7, wherein the first, second and third polycrystalline layers comprise silicon, and one of the first, second and third polycrystalline layers is doped with carbon, germanium, or a combination thereof.

10. The semiconductor device structure as claimed in claim 7, wherein the carrier-trapping stack layer is doped with different dopants.

11. The semiconductor device structure as claimed in claim 7, wherein the carrier-trapping stack layer is doped with a first dopant, and the active element comprises source and drain structures doped with a second dopant, and wherein the first dopant is different from the second dopant.

12. The semiconductor device structure as claimed in claim 11, wherein the first dopant in the carrier-trapping stack layer is in a range from about 0.1 atomic ratio (at. %) to about 5 at. %.

13. The semiconductor device structure as claimed in claim 7, wherein the insulating layer is in contact with the third polycrystalline layer.

14. A semiconductor device structure, comprising:
a supporting substrate;
an insulating layer over the supporting substrate;
a plurality of first carrier-trapping layers and a plurality of second carrier-trapping layers alternately formed between the supporting substrate and the insulating layer, and one of the plurality of first carrier-trapping layers is above and in contact with the supporting substrate, and another one of the plurality of first carrier-trapping layers is below and in contact with the insulating layer;
a semiconductor substrate over the insulating layer and having source and drain structures; and
a gate stack over the semiconductor substrate,
wherein the plurality of second carrier-trapping layers comprises polysilicon, the plurality of first carrier-trapping layers comprises amorphous-like silicon and has a grain size and a thickness less than those of the plurality of second carrier-trapping layers, and the first carrier-trapping layer in contact with the supporting substrate is doped with carbon and germanium.

15. The semiconductor device structure as claimed in claim 14, wherein the supporting substrate and the insulating layer are respectively separated from the plurality of second carrier-trapping layers by two of the plurality of first carrier-trapping layers.

16. The semiconductor device structure as claimed in claim 14, wherein a number of the plurality of first carrier-trapping layers is one (1) more than a number of the plurality of second carrier-trapping layers.

17. The semiconductor device structure as claimed in claim 14, wherein the plurality of second carrier-trapping layers are doped with group-IV dopants.

18. The semiconductor device structure as claimed in claim 17, wherein the plurality of second carrier-trapping layers are doped with carbon and germanium.

19. The semiconductor device structure as claimed in claim 14, wherein the plurality of second carrier-trapping layers are substantially free of dopants.

20. The semiconductor device structure as claimed in claim 14, wherein the first carrier-trapping layer in contact with the insulating layer is free of group-IV dopants.

* * * * *